(12) United States Patent
Sakong et al.

(10) Patent No.: US 10,957,833 B2
(45) Date of Patent: Mar. 23, 2021

(54) LIGHT EMITTING DIODE DISPLAY DEVICE

(71) Applicant: Samsung Electronics Co., Ltd., Suwon-si (KR)

(72) Inventors: Tan Sakong, Seoul (KR); Yong Il Kim, Seoul (KR); Han Kyu Seong, Seoul (KR); Ji Hye Yeon, Suwon-si (KR); Chung Sun Lee, Anyang-si (KR); Ji Hwan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 16/356,283

(22) Filed: Mar. 18, 2019

(65) Prior Publication Data

US 2019/0305202 A1 Oct. 3, 2019

(30) Foreign Application Priority Data

Apr. 3, 2018 (KR) .................. 10-2018-0038440

(51) Int. Cl.
*H01L 33/00* (2010.01)
*H01L 33/62* (2010.01)
*H01L 25/075* (2006.01)
*H01L 27/12* (2006.01)
*H01L 23/00* (2006.01)

(52) U.S. Cl.
CPC ............ *H01L 33/62* (2013.01); *H01L 24/13* (2013.01); *H01L 25/0753* (2013.01); *H01L 27/1214* (2013.01); *H01L 2224/13111* (2013.01); *H01L 2224/13139* (2013.01); *H01L 2224/13347* (2013.01); *H01L 2224/13355* (2013.01); *H01L 2924/381* (2013.01)

(58) Field of Classification Search
CPC ...... H01L 33/62; H01L 33/0093; H01L 24/13
See application file for complete search history.

(56) References Cited

U.S. PATENT DOCUMENTS

2016/0351843 A1 12/2016 Yang et al.
2017/0069611 A1 3/2017 Zhang et al.
(Continued)

FOREIGN PATENT DOCUMENTS

| KR | 20170047641 A | 5/2017 |
|---|---|---|
| KR | 20170073590 A | 6/2017 |
| WO | WO 2016-060676 | 4/2016 |

*Primary Examiner* — Samuel A Gebremariam
(74) *Attorney, Agent, or Firm* — Muir Patent Law, PLLC

(57) ABSTRACT

A light emitting diode display device includes a display board comprising a plurality of unit pixels, a drive circuit board including a plurality of drive circuit regions corresponding to the plurality of unit pixels, and a plurality of bumps interposed between the plurality of unit pixels and the plurality of drive circuit regions. The plurality of unit pixels comprises a first unit pixel including a first P electrode. The plurality of drive circuit regions comprises a first drive circuit region corresponding to the first unit pixel and a first pad connected to a first drive transistor, the plurality of bumps includes a first solder in contact with the first pad, and a first bump on the first solder and including a first filler in contact with the first P electrode, the first solder includes at least one of tin and silver, and the first filler includes copper or nickel.

20 Claims, 13 Drawing Sheets

(56) References Cited

U.S. PATENT DOCUMENTS

| | | |
|---|---|---|
| 2017/0242161 A1 | 8/2017 | Zhang et al. |
| 2017/0256521 A1 | 9/2017 | Cok et al. |
| 2017/0309798 A1 | 10/2017 | Bonar et al. |
| 2017/0345801 A1* | 11/2017 | Lin .................... H01L 33/0093 |
| 2017/0352646 A1 | 12/2017 | Bower et al. |

* cited by examiner

LIGHT EMITTING DIODE DISPLAY DEVICE

This application claims the benefit of priority under 35 U.S.C. § 119 from Korean Patent Application No. 10-2018-0038440, filed Apr. 3, 2018, in the Korean Intellectual Property Office, the disclosure of which is incorporated herein by reference in its entirety.

BACKGROUND

1. Field

The present disclosure relates to a light emitting diode display device and, more particularly, to a light emitting diode display device formed on a substrate.

2. Description of the Related Art

Recently, the display device has been miniaturized and improved in performance. As a result, a distance between pixels including the light emitting diodes has been narrowed. In a case where the distance between the pixels including the light emitting diodes is narrow, there may be a high possibility of short-circuit between the light emitting diode and a bump for bonding a drive circuit. Further, in a case where the distance between the pixels including the light emitting diode is narrow, the fluidity of a material such as a NCF (Non-conducting Film) for filling a gap between the light emitting diode and the drive circuit may be reduced.

On the other hand, a light emitting diode chip may include one pixel including the light emitting diode, and the drive circuit. When separately cutting the light emitting diode chips to manufacture the display device, the time required for the manufacturing process of the display device may be increased.

SUMMARY

An aspect of the disclosed embodiments provides a light emitting diode display device which is capable of improving the yield of a display device, by reducing the possibility of short-circuit of bumps for bonding a display board including a light emitting diode and a drive circuit board including a drive transistor.

Another aspect of the disclosed embodiments provides a light emitting diode display device which is capable of improving the yield of the display device, by increasing the fluidity of a non-conducting material through an arrangement of a plurality of bumps.

Still another aspect of the disclosed embodiments provides a light emitting diode display device which is capable of reducing the time required for the manufacturing process of the display device, by integrally bonding the display board on which the light emitting diodes are disposed and the drive circuit board including the drive transistor.

The aspects of the disclosed embodiments are not limited to those mentioned above and another aspect which has not been mentioned can be clearly understood by those skilled in the art from the description below.

According to some embodiments, the disclosure is directed to a light emitting diode display device comprising: a display board comprising a plurality of unit pixels; a drive circuit board which includes a plurality of drive circuit regions, each of the plurality of drive circuit regions corresponding to one of the plurality of unit pixels; and a plurality of bumps, each of the plurality of bumps being interposed between the each of the plurality of unit pixels and the corresponding one of the plurality of drive circuit regions to connect the display board and the drive circuit board, wherein the plurality of unit pixels comprises a first unit pixel comprising a first P electrode, wherein the plurality of drive circuit regions comprises a first drive circuit region which corresponds to the first unit pixel and a first pad connected to a first drive transistor, wherein the plurality of bumps includes a first solder which is in direct contact with the first pad and a first bump disposed on the first solder and including a first filler which is in direct contact with the first P electrode, wherein the first solder includes at least one of tin and silver, and wherein the first filler includes one of copper and nickel.

According to some embodiments, the disclosure is directed to a light emitting diode display device comprising: a display board including first and second light emitting diode pixels spaced apart from each other in a first direction; first and second light emitting diode layers included in the first and second light emitting diode pixels, respectively; first and second P electrodes disposed on the first and second light emitting diode layers, respectively; a first bump which is in contact with the first P electrode; and a second bump which is in contact with the second P electrode, wherein the first bump and the second bump are spaced apart from each other along a second direction intersecting with the first direction.

According to some embodiments, the disclosure is directed to a light emitting diode display device comprising: a drive circuit board including first, second, third, and fourth pads; first, second, third, and fourth bumps disposed on the first, second, third, and fourth pads, respectively; a first light emitting diode layer including a first P electrode being in contact with the first bump and a first N electrode being in contact with the second bump; and a second light emitting diode layer including a second P electrode being in contact with the third bump and a second N electrode being in contact with the fourth bump, wherein the first and third pads are respectively connected to first and second drive transistors included in the drive circuit board, wherein each of the second and fourth pads is connected to a ground voltage, wherein a first direction in which the second and fourth bumps are spaced apart from each other intersects with a second direction in which the first and third bumps are spaced apart from each other, wherein the first bump includes a first solder being in direct contact with the first pad and a first filler disposed on the first solder, the first filler being in direct contact with the first P electrode, wherein the first solder includes at least one of tin and silver, and wherein the first filler includes one of copper and nickel.

BRIEF DESCRIPTION OF THE DRAWINGS

The above and other aspects and features will become more apparent by describing in detail exemplary embodiments thereof with reference to the attached drawings, in which.

DETAILED DESCRIPTION

A light emitting diode display device according to some example embodiments will be described below with reference to FIGS. 1 to 7.

Figure 1:
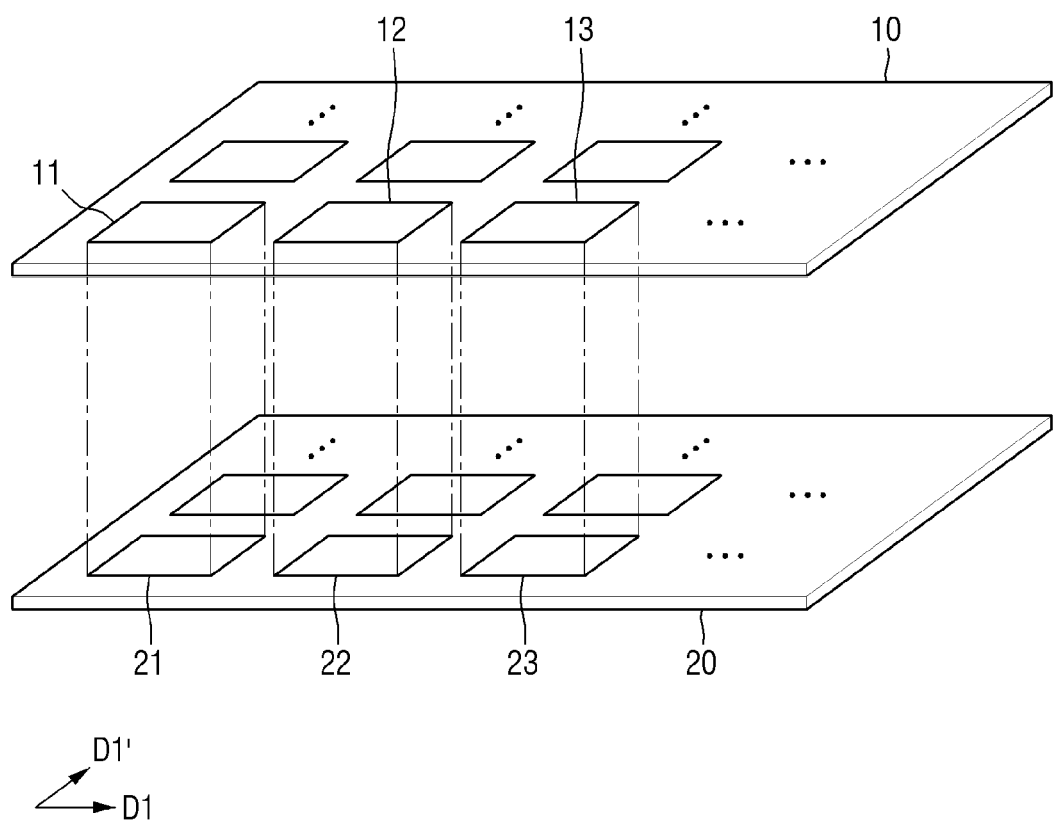
FIG. 1 is a diagram illustrating a light emitting diode display device according to some embodiments.

FIG. 1 is a diagram illustrating a light emitting diode display device according to some example embodiments.

Referring to FIG. 1, the light emitting diode display device according to some example embodiments may include a display board 10 and a drive circuit board 20.

The display board 10 may include a plurality of unit pixels. Each of the plurality of unit pixels of the display board 10 may be aligned to be spaced apart from each other along a first direction D1 and a first' direction D1', which is perpendicular to the first direction D1. The first' direction' D1' may be a direction intersecting with the first direction D1, and on the same horizontal plane. In the drawing, the first direction D1 is illustrated as intersecting with the first' direction D1' each other, but the disclosure is not limited thereto. For example, the first direction D1 and the first' direction D1' may have arbitrary angles with respect to each other.

The plurality of unit pixels of the display board 10 may include a first unit pixel 11, a second unit pixel 12 and a third unit pixel 13 aligned along the first direction D1. The first unit pixel 11, the second unit pixel 12, and the third unit pixel 13 may be, for example, regions of the display board 10 which are spaced apart from each other. The display board 10 may further include additional unit pixels may be aligned along the first direction D1 and the first' direction D1', and may be spaced apart from one another and the first, second, and third unit pixels 11, 12, and 13 along the first and first' directions D1 and D1'. In some embodiments, the display board 10 may be a printed circuit board.

The drive circuit board 20 may include a plurality of drive circuit regions. Each of the plurality of drive circuit regions may be aligned to be spaced apart from each other along the first direction D1 and the first' direction D1'.

Each of the plurality of drive circuit regions of the drive circuit board 20 may correspond to one of the plurality of unit pixels of the display board 10. For example, the plurality of drive circuit regions of the drive circuit board 20 may include a first drive circuit region 21, a second drive circuit region 22, and a third drive circuit 22, which are aligned along the first direction D1.

The first drive circuit region 21 may correspond to the first unit pixel 11. The second drive circuit region 22 may correspond to the second unit pixel 12. The third drive circuit region 23 may correspond to the third unit pixel 13. For example, the display board 10 and the drive circuit board 20 may be connected to each other, e.g., bonded by a plurality of bumps to be described later. When the display board 10 and the drive circuit board 20 are connected to each other by the plurality of bumps, the first unit pixel 11 may be located on the first drive circuit region 21, the second unit pixel 12 may be located on the second drive circuit region 22, and the third unit pixel 13 may be located on the third drive circuit region 23. For example, the first unit pixel 11 may be aligned above the first drive circuit region 21, the second unit pixel 12 may be aligned above the second drive circuit region 22, and the third unit pixel 13 may be aligned above the third drive circuit region 23.

In some embodiments, each of the first drive circuit region 21, the second drive circuit region 22, and the third drive circuit region 23 may receive pixel data from a source (e.g., an image processor or the like) external to the drive circuit board 20, and may provide this pixel data to the corresponding first unit pixel 11, second unit pixel 12, or third unit pixel 13 to cause the first, second, or third unit pixel 11, 12, or 13 to emit light corresponding to the received pixel data. Each of the first unit pixel 11, the second unit pixel 12, and the third unit pixel 13 may be driven individually.

Figure 2:
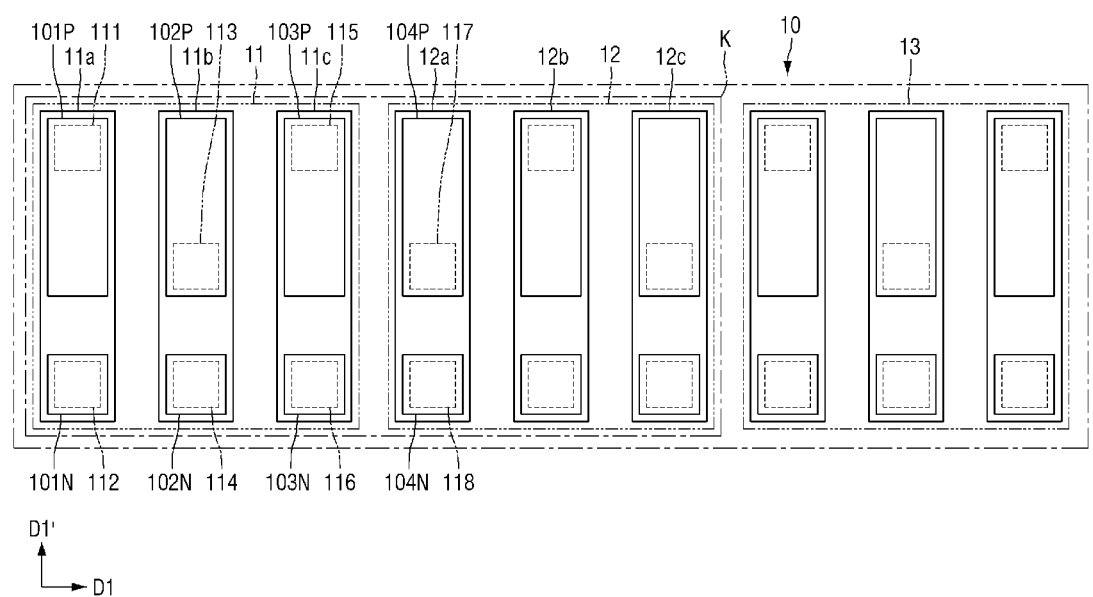
FIG. 2 is a diagram illustrating a partial region of the display board of FIG. 1.

FIG. 2 is a diagram illustrating a partial region of the display board 10 of FIG. 1, and may be a plan view for explaining the first unit pixel 11 and the second unit pixel 12 according to some example embodiments.

Referring to FIGS. 1 and 2, each of the first unit pixel 11, the second unit pixel 12, and the third unit pixel 13 may include at least one light emitting diode pixel.

For example, the first unit pixel 11 may include a first light emitting diode pixel 11a, a second light emitting diode pixel 11b, and a third light emitting diode pixel 11c. The second unit pixel 12 may include, for example, a fourth light emitting diode pixel 12a, a fifth light emitting diode pixel 12b, and a sixth light emitting diode pixel 12c. The third unit pixel 13 may include, for example, the same constituent elements as those included in the first unit pixel 11. Each of the light emitting diode pixels (e.g., first light emitting diode pixel 11a, second light emitting diode pixel 11b, third light emitting diode pixel 11c, fourth light emitting diode pixel 12a, fifth light emitting diode pixel 12b, sixth light emitting diode pixel 12c, etc.) may be driven individually to provide an intensity corresponding to the received pixel data to emit a color corresponding to the pixel data of the corresponding unit pixel (e.g., first unit pixel 11, second unit pixel 12, etc.). Light emitting diode pixels may be driven individually by, for example, applying different driving voltage across individual light emitting diode pixels of a unit pixel that do not cause other light emitting diode pixels of the unit pixel to operate.

The first light emitting diode pixel 11a, the second light emitting diode pixel 11b, and the third light emitting diode pixel 11c may be arranged along the first direction D1. The first light emitting diode pixel 11a, the second light emitting diode pixel 11b, and the third light emitting diode pixel 11c may be spaced apart from each other in both the first and first' directions D1 and D1'.

Each of the light emitting diode pixels may include a P electrode and an N electrode. The P electrode may be a p-type electrode (e.g., doped with p-type impurities), and the N electrode may be an n-type electrode (e.g., doped with n-type impurities). For example, the first, second, third, and fourth light emitting diode pixels 11a, 11b, 11c, and 12a may include first, second, third and fourth P electrodes 101P, 102P, 103P, and 104P, respectively. Further, the first, second, third, and fourth light emitting diode pixels 11a, 11b, 11c, and 12a may include first, second, third, and fourth N electrodes 101N, 102N, 103N, and 104N, respectively.

Figure 7:
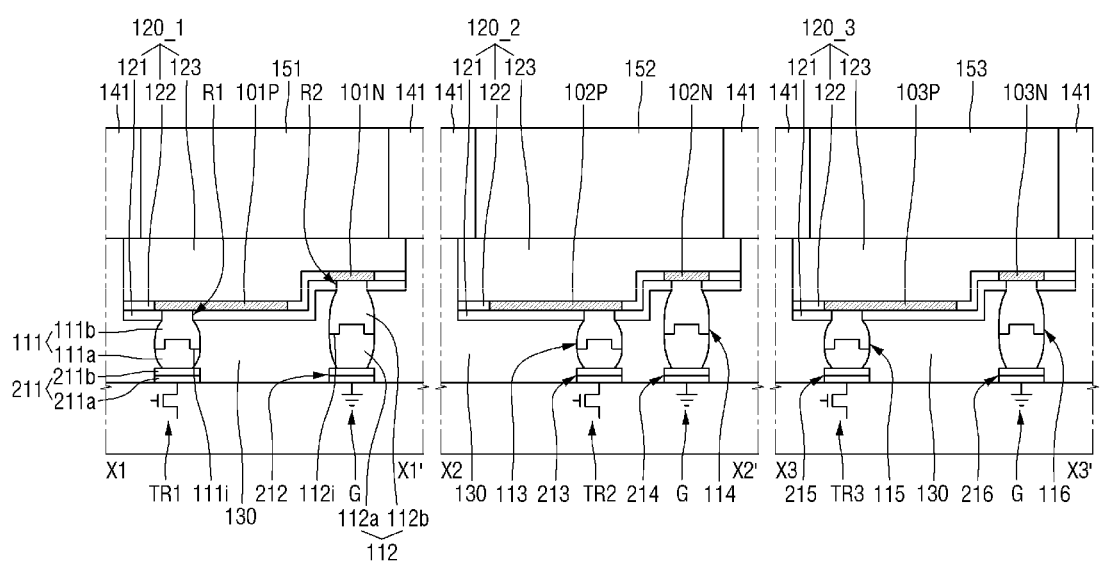
FIG. 7 is a cross-sectional view taken along lines X1-X1', X2-X2', and X3-X3' of FIG. 6.

Here, as discussed further in connection with FIG. 7, the P electrodes may be electrodes of the light emitting diode layers (e.g., the first, second and third light emitting diode layers 120-1, 120-2, and 120-3 of FIG. 7) connected to the drive transistors (e.g., the first, second and third drive transistors TR1, TR2, and TR3 of FIG. 7) of the drive circuit board 20. Further, the N electrodes may be electrodes of the light emitting diode layer (e.g., the first, second and third light emitting diode layers 120-1, 120-2, and 120-3 of FIG. 7) connected to a ground voltage (e.g., a ground voltage G of FIG. 7).

Each of the first, second, third, and fourth P electrodes 101P, 102P, 103P, and 104P may be spaced apart from each of the first, second, third and fourth N electrodes 101N, 102N, 103N, and 104N. For example, the first, second, third, and fourth P electrodes 101P, 102P, 103P, and 104P may be spaced apart from the respective first, second, third and fourth N electrodes 101N, 102N, 103N, and 104N in the first direction D1'.

Each of the first, second, third, and fourth P electrodes 101P, 102P, 103P, and 104P may be disposed to be spaced apart from each other, for example, along the first direction D1. Each of the first, second, third, and fourth P electrodes 101P, 102P, 103P, and 104P may be disposed, for example, in a row that extends in the first direction D1. Each of the first, second, third, and fourth N electrodes 101N, 102N, 103N, and 104N may be disposed to be spaced apart from each other along, for example, the first direction D1. Each of the first, second, third, and fourth N electrodes 101N, 102N, 103N, and 104N may be disposed, for example, in a row that extends in the first direction D1.

In some example embodiments, each of the first, second, third, and fourth P electrodes 101P, 102P, 103P, and 104P may be disposed on one side of each of the first, second, third, and fourth N electrodes 101N, 102N, 103N, and 104N.

A plurality of bumps may be attached to the display board 10. For example, the plurality of bumps may be interposed between the display board 10 and the drive circuit board 20. For example, the plurality of bumps may be interposed between each of the plurality of unit pixels of the display board 10 and each of the plurality of drive circuit regions of the drive circuit board 20.

The plurality of bumps may include first, second, third, fourth, fifth, sixth, seventh and eighth bumps 111, 112, 113, 114, 115, 116, 117, and 118. The first, third, fifth and seventh bumps 111, 113, 115, and 117 may be attached to the first, second, third and fourth P electrodes 101P, 102P, 103P, and 104P, respectively. The second, fourth, sixth and eighth bumps 112, 114, 116, and 118 may be attached to the first, second, third and fourth N electrodes 101N, 102N, 103N, and 104N, respectively.

The arrangement of the plurality of bumps included in each of the first and second unit pixels 11 and 12 may be different from each other. Further, the arrangement of the plurality of bumps included in each of the first and third unit pixels 11 and 13 may be the same. The arrangement of the plurality of bumps of each of the first and second unit pixels 11 and 12 may be repeated, for example, using the first and second unit pixels 11 and 12 as a basic unit.

In some embodiments, each of the first, second, and third unit pixels 11, 12, and 13 may be formed as a separate chip. In other embodiments, the first, second, and third unit pixels 11, 12, and 13 may form a single chip, and a plurality of such chips may form the display board 10.

Figure 3:
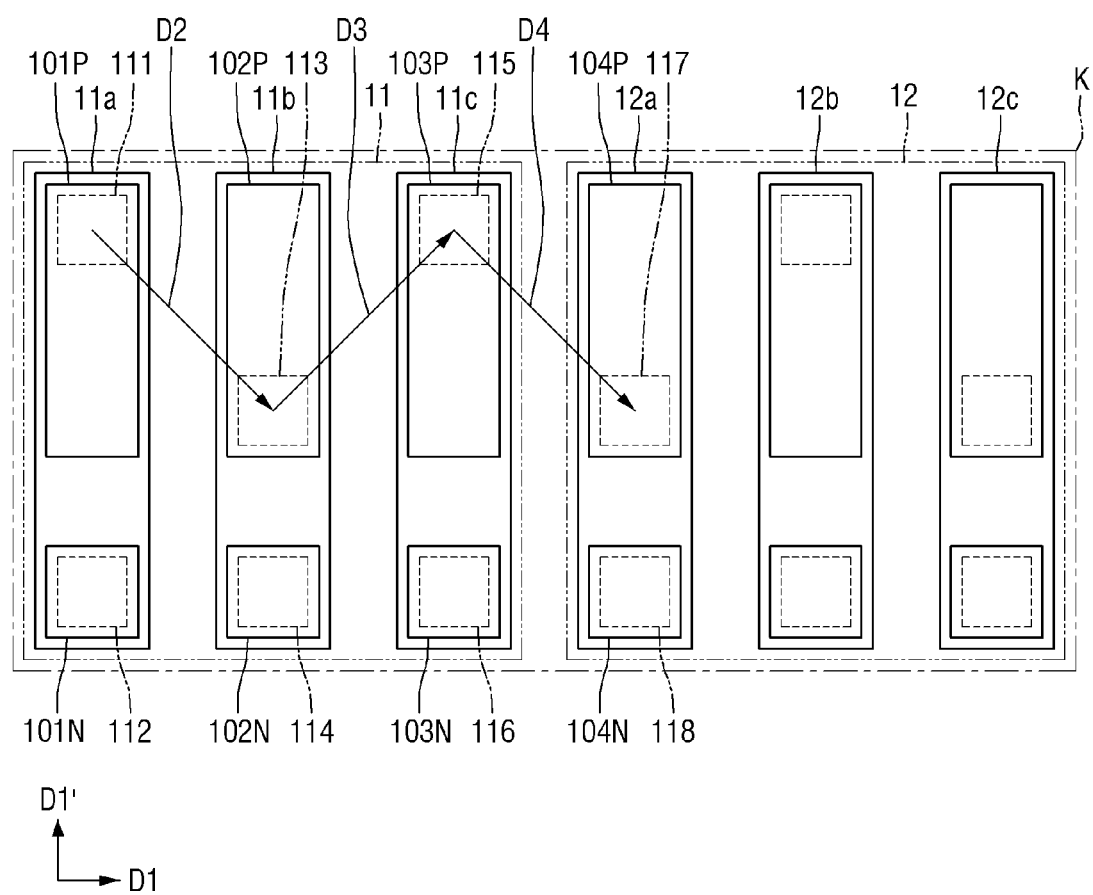
FIGS. 3 and 4 are enlarged views of a region K of FIG. 2, respectively.
Figure 4:
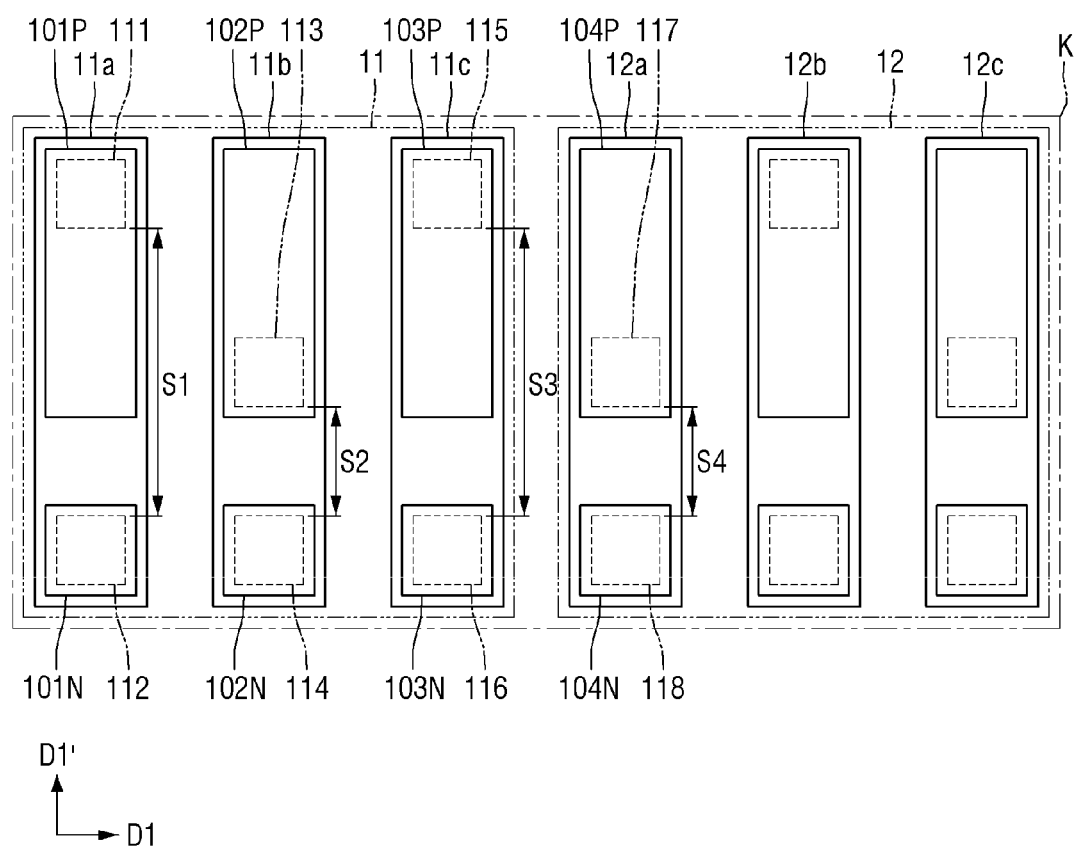

FIGS. 3 and 4 are enlarged views of the region K of FIG. 2, respectively.

Referring to FIGS. 3 and 4, the first bump 111 and the third bump 113 may be spaced apart from each other along the second direction D2. The second direction D2 may be a direction intersecting with the first direction D1. For example, the second direction D2 and the first direction D1 may be directions intersecting with each other at an arbitrary angle, without being perpendicular thereto. For example, in a first light emitting diode pixel 11a and a second light emitting diode pixel adjacent to each other, the first bump 111 adjacent to the first P electrode 101P and the third bump 113 adjacent to the second P electrode 102P may not be arranged side by side, for example, along the first direction D1.

The third bump 113 and the fifth bump 115 may be spaced apart from each other along the third direction D3. The third direction D3 may be a direction intersecting with the first direction D1 and the second direction D2. For example, the third direction D3 may be a direction intersecting with the first direction D1 and the second direction D2 at an arbitrary angle, without being perpendicular thereto. For example, in the second light emitting diode pixel 11b and the third light emitting diode pixel 11c adjacent to each other, the third bump 113 adjacent to the third P electrode 103P and the fifth bump 115 adjacent to the fifth P electrode 105P may not be aligned side by side, for example, along the first direction D1.

The fifth bump 115 and the seventh bump 117 may be spaced apart from each other along the fourth direction D4. The fourth direction D4 may be a direction intersecting with the first direction D1, the second direction D2 and the third direction D3. For example, the fourth direction D4 may be a direction intersecting with each of the first direction D1, the second direction D2, and the third direction D3 at an arbitrary angle, without being perpendicular thereto. For example, in the third light emitting diode pixel 11c and the fourth light emitting diode pixel 12a adjacent to each other, the fifth bump 115 adjacent to the third P electrode 103P and the seventh bump 117 adjacent to the fourth P electrode 104P may not be arranged side by side along the first direction D1.

In some example embodiments, the first bump 111 and the fifth bump 115 may be spaced apart from each other along the first direction D1. In addition, the second bump 112, the fourth bump 114, and the sixth bump 116 may be spaced apart from each other along the first direction D1. In addition, the third bump 113 and the seventh bump 117 may be spaced apart from each other along the first direction D1.

A first distance S1 at which the first bump 111 and the second bump 112 are spaced apart from each other in the first' direction D1' in the first light emitting diode pixel 11a may be greater than a second distance S2 at which the third bump 113 and the fourth bump 114 are spaced apart from each other in the first' direction D1' in the second light emitting diode pixel 11b. A third distance S3 at which the fifth bump 115 and the sixth bump 116 are spaced apart from each other in the first' direction D1' in the third light emitting diode pixel 11c may be greater than the second distance S2 and a fourth distance S4. The fourth distance S4 may be a distance at which the seventh bump 117 and the eighth bump 118 are spaced apart from each other in the first' direction D1' in the fourth light emitting diode pixel 12a.

In some example embodiments, the first distance S1 and the third distance S3 may be the same, and the second distance S2 and the fourth distance S4 may be the same.

In the light emitting diode display device according to some example embodiments, since the bumps attached to the P electrodes of the light emitting diode pixels adjacent to each other are not aligned in a row, the possibility of short-circuit of the bump for bonding the display board including the light emitting diode and the drive circuit board including the drive transistor is reduced, thereby making it possible to reduce the yield of the display device. For example, since the first bump 111 and the third bump 113 are spaced apart from each other in the second direction D2, and the third bump 113 and the fifth bump 115 are spaced apart from each other in the third direction D3, it is possible to reduce the possibility of short-circuit between the first bump 111, the third bump 113 and the fifth bump 115.

Figure 5:
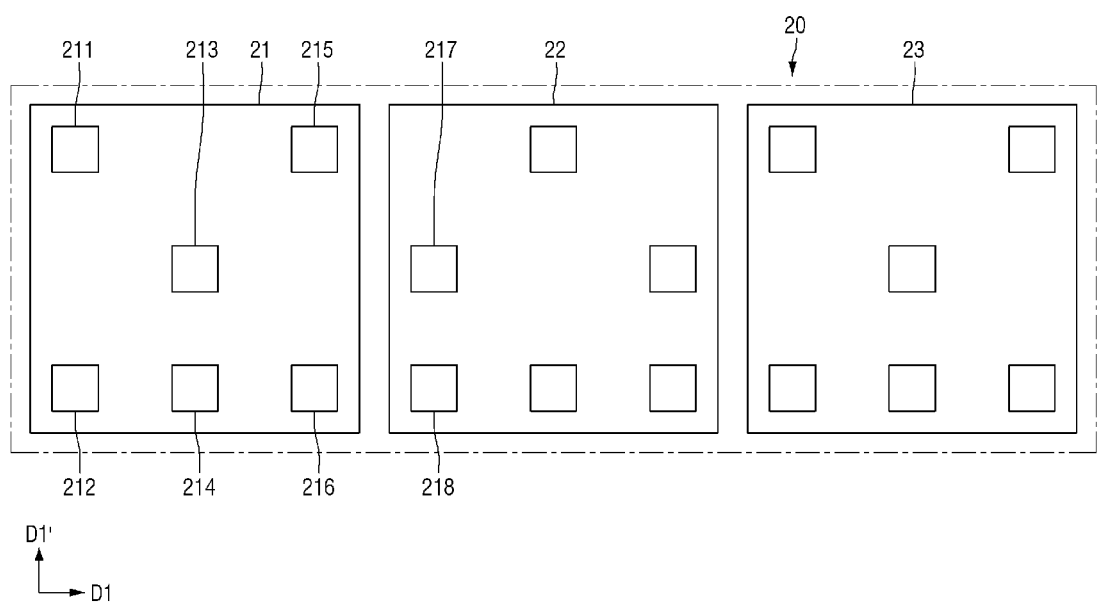
FIG. 5 is a diagram illustrating a partial region of the drive circuit board of FIG. 1.
Figure 6:
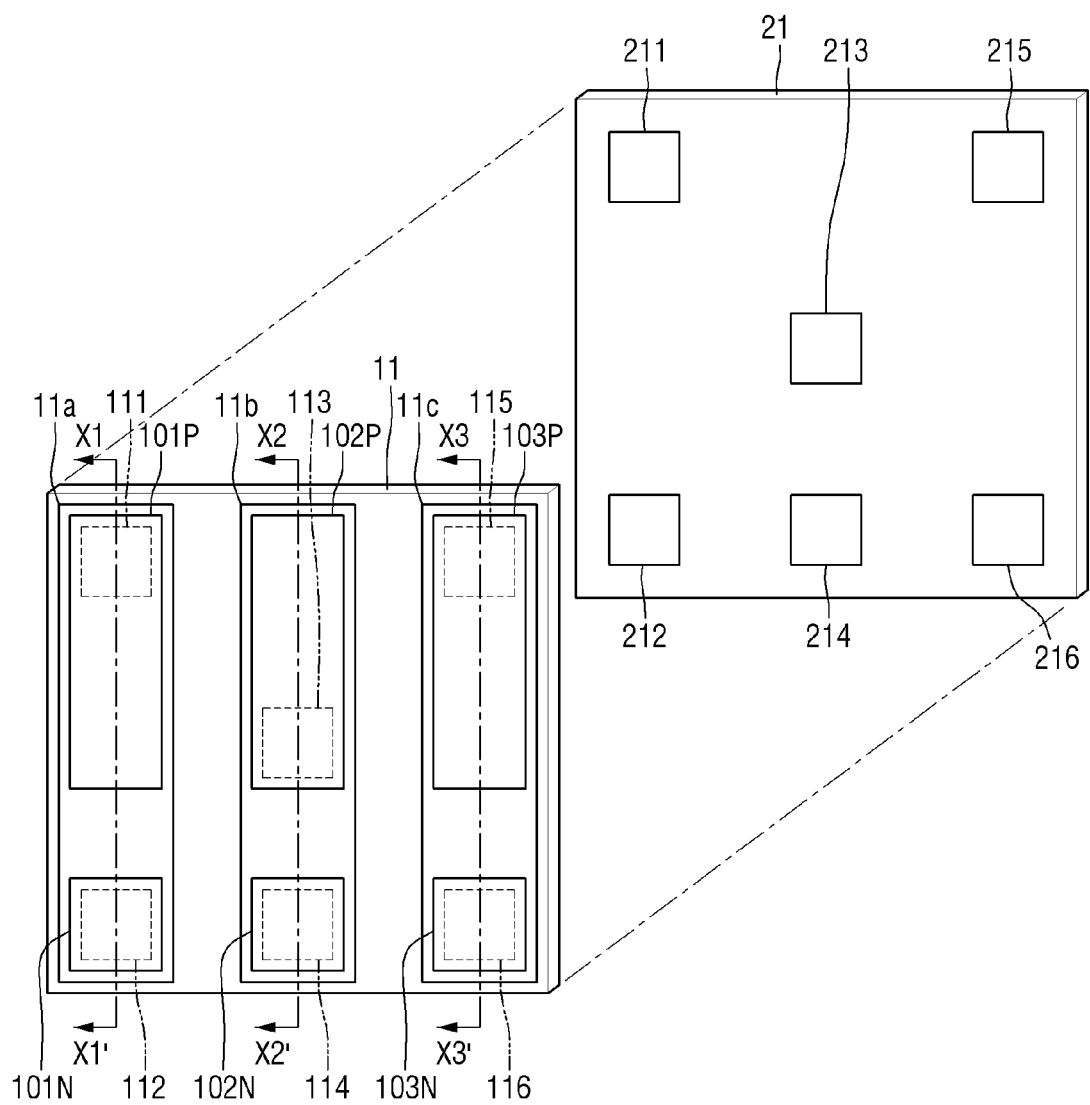
FIG. 6 is a diagram illustrating a part of each of the display board and the drive circuit board of FIG. 1.

FIG. 5 is a diagram illustrating a partial region of the drive circuit board 20 of FIG. 1, and may be a plan view which illustrates the first drive circuit region 21 and the second drive circuit region 22 according to some example embodiments. FIG. 6 is a diagram illustrating a part of each of the display board 10 and the drive circuit board 20 of FIG. 1.

Referring to FIGS. 1, 5 and 6, first, second, third, fourth, fifth and sixth pads 211, 212, 213, 214, 215, and 216 may be disposed in the first drive circuit region 21. A seventh pad 217 and an eighth pad 218 may be disposed in the second drive circuit region 22. As shown in FIG. 5, additional pads may be disposed in the second drive circuit region 22 and the third drive circuit region 23.

Each of the first, second, third, fourth, fifth, and sixth pads 211, 212, 213, 214, 215, and 216 may be located on the drive circuit board 20 to correspond to a respective one of the first, second, third, fourth, fifth, and sixth bumps 111, 112, 113, 114, 115, and 116.

The first bump 111 may be interposed between the first P electrode 101P and the first pad 211. The second bump 112 may be interposed between the first N electrode 101N and the second pad 212. The third bump 113 may be interposed between the second P electrode 102P and the third pad 213. The fourth bump 114 may be interposed between the second N electrode 102N and the fourth pad 214. The fifth bump 115 may be interposed between the third P electrode 103P and the fifth pad 215. The sixth bump 116 may be interposed between the third N electrode 103N and the sixth pad 216.

The first, second, and third P electrodes 101P, 102P, and 103P may be connected respectively to the first, second and fifth pad 211, 213, and 215 through each of the first, third and fourth bumps 111, 113, and 115, respectively. The first, second, and third N electrodes 101N, 102N, and 103N may be connected to the second, fourth and sixth pads 212, 214, and 216 through each of the second, fourth, and sixth bumps 112, 114, and 116, respectively.

In the light emitting diode display device according to some example embodiments, by not cutting each unit pixel and each drive circuit region of the drive circuit board, and instead integrally bonding the drive circuit board and the display board including the plurality of unit pixels using bumps, it is possible to reduce the time required for the manufacturing process of the display device.

In the drawings, each of the first, second, third, fourth, fifth and sixth pads 211, 212, 213, 214, 215, and 216 is illustrated as being formed to have substantially the same size as the corresponding first, second, third, fourth, fifth and sixth bumps 111, 112, 113, 114, 115, and 116, but the embodiments are not limited thereto. For example, each of the first, second, third, fourth, fifth, and sixth pads 211, 212, 213, 214, 215, and 216 may be formed to have a size different from the corresponding first, second, third, fourth, fifth and the sixth bumps 111, 112, 113, 114, 115, and 116. For example, each of the first and fifth pads 211 and 215 may be formed to extend in the direction in which the second and sixth pads 212 and 216 are disposed, while being spaced apart from each of the second and sixth pads 212 and 216. Further, for example, the third pad 213 may be formed to further extend in a direction opposite to the direction in which the fourth pad 214 is disposed, while being spaced apart from the fourth pad 214.

FIG. 7 is a cross-sectional view taken along lines X1-X1', X2-X2', and X3-X3' of FIG. 6. FIG. 7 may be a cross-sectional view taken along lines X1-X1', X2-X2', and X3-X3' after bonding the display board 10 and the drive circuit board 20, using a plurality of bumps.

Referring to FIGS. 6 and 7, the first light emitting diode pixel 11a may include a first light emitting diode layer 120_1 and a first color conversion layer 151. The second light emitting diode pixel 11b may include a second light emitting diode layer 120_2 and a second color conversion layer 152. The third light emitting diode pixel 11c may include a third light emitting diode layer 120_3 and a third color conversion layer 153.

The first, second and third light emitting diode layers 120_1, 120_2, and 120_3 each may include a lower layer 121, an upper layer 122, and a base layer 123. The upper layer 122 may be interposed between the lower layer 121 and the base layer 123, extending to prevent contact between the lower layer 121 and the base layer 123.

In the drawings, the first, second and third light emitting diode layers 120_1, 120_2, and 120_3 are illustrated to include the lower layer 121, the upper layer 122 and the base layer 123, but the embodiments are not limited thereto. For example, either one of the lower layer 121 and the upper layer 122 of the first, second and third light emitting diode layers 120_1, 120_2, and 120_3 may be omitted, and the first, second, and third light emitting diode layers 120_1, 120_2, and 120_3 may further include other layers.

The lower layer 121 may include at least one recess. The at least one recess of the lower layer 121 may accommodate at least a part of each of the plurality of bumps. The at least one recess of the lower layer 121 may extend through the lower layer 121, and may expose a surface of the P electrode and/or the N electrode.

For example, a first recess R1 of the lower layer 121 of the first light emitting diode pixel 11a may expose the first P electrode 101P. Further, the second recess R2 of the lower layer 121 of the first light emitting diode pixel 11a may expose the first N electrode 101N.

In some example embodiments, the lower layer 121 may be either a reflective layer or an insulating layer. In some example embodiments, the lower layer 121 may be a multi-layer comprising different material layers. When the lower layer 121 is a multi-layer, the lower layer 121 may be a combination of at least one reflective layer and at least one insulating layer.

The upper layer 122 may include a P electrode and an N electrode. In some example embodiments, the P electrode and the N electrode may extend from a bottom surface to a top surface of the upper layer 122. For example, the upper layer 122 of the first light emitting diode pixel 11a may include a first P electrode 101P and a first N electrode 101N, the upper layer 122 of the second light emitting diode pixel 11b may include a second P electrode 102P and a second N electrode 102N, and the upper layer 122 of the third light emitting diode pixel 11c may include a third P electrode 103P and a third N electrode 103N. The first P electrode 101P and the first N electrode 101N may be disposed in the upper layer 122. For example, the upper layer 122 may be an insulating layer.

A base layer 123 may be disposed on the upper layer 122. The base layer 123 may be disposed between the P electrode and the color conversion layer, and between the N electrode and the color conversion layer. For example, the base layer 123 may be disposed between the first P electrode 101P and the first color conversion layer 151, and between the first N electrode 101N and the first color conversion layer 151. Further, the base layer 123 may be disposed between the second P electrode 102P and the second color conversion layer 152, and between the second N electrode 102N and the second color conversion layer 151. And the base layer 123 may be disposed between the third P electrode 103P and the third color conversion layer 153, and between the third N electrode 103N and the third color conversion layer 153. The base layer 123 may include, for example, a base substrate. The base substrate may be, for example, sapphire glass, but the disclosure is not limited thereto.

In the drawings, the base layer 123 is illustrated as a single layer, but the embodiments are not limited thereto. For example, it is a matter of course that the base layer 123 may be a multi-layer in which various layers are stacked.

The base layer 123 may include, for example, a nitride-based semiconductor material. The base layer 123 may include, for example, at least one of GaN, AlGaN, InGaN, AlInGaN, and combinations thereof For example, relative to the upper surface of the first drive circuit region 21 of the drive circuit board 20, the lower surface of the first P electrode 101P may be located to be lower than the lower surface of the first N electrode 101N, the lower surface of the second P electrode 102P may be located to be lower than the lower surface of the second N electrode 102N, and the lower surface of the third P electrode 103P may be located to be lower than the lower surface of the third N electrode 103N. However, the embodiments are not limited thereto. For example, relative to the upper surface of the first drive circuit region 21 of the drive circuit board 20, the lower surface of the first P electrode 101P may be located at the same level as the lower surface of the first N electrode 101N or may be located to be lower than the lower surface of the first N electrode 101N, the lower surface of the second P electrode 102P may be located at the same level as the lower surface of the second N electrode 102N or may be located to be lower than the lower surface of the second N electrode 102N, and the lower surface of the third P electrode 103P may be located at the same level as the lower surface of the third N electrode 103N or may be located to be lower than the lower surface of the third N electrode 103N.

Further, in the example of FIG. 7, relative to the upper surface of the first drive circuit region 21 of the drive circuit board 20, the lower surface of the first P electrode 101P may be located at the same level as the lower surface of the second P electrode 102P and the lower surface of the third P electrode 103P, and the lower surface of the first N electrode 101N may be at the same level as the lower surface of the second N electrode 102N and the lower surface of the third N electrode 103N.

The first bump 111 may be interposed between the first light emitting diode layer 120_1 and the first drive circuit region 21 of the drive circuit board 20. Specifically, the first bump 111 may be interposed between the first P electrode 101P and the first pad 211 disposed in the first drive circuit region 21 of the drive circuit board 20. The first bump 111 may be disposed on the first pad 211. For example, the first bump 111 may come into contact with a top surface of the first pad 211 and a bottom surface of the first P electrode 101P.

The second bump 112 may be interposed between the first light emitting diode layer 120_1 and the first drive circuit region 21 of the drive circuit board 20. Specifically, the second bump 112 may be interposed between the first N electrode 101N and the second pad 212 disposed in the first drive circuit region 21 of the drive circuit board 20. The second bump 112 may be disposed on the second pad 212. For example, the second bump 112 may come into contact with a top surface of the second pad 212 and a bottom surface of the first N electrode 101N. The first bump 111 may include a first solder 111a and a first filler 111b. The second bump 112 may include a second solder 112a and a second filler 112b.

The first solder 111a and the second solder 112a may be disposed on the first pad 211 and the second pad 212, respectively. For example, each of the first solder 111a and the second solder 112a may come into direct contact with the corresponding one of the first pad 211 and the second pad 212.

The first solder 111a and the second solder 112a may include at least one of, for example, tin and silver.

The first filler 111b and the second filler 112b may be disposed on the first solder 111a and the second solder 112a, respectively. At least a part of the first filler 111b is inserted into the first recess R1 and may come into direct contact with the first P electrode 101P. At least a part of the second filler 112b is inserted into the second recess R2 and may come into direct contact with the first N electrode 101N.

The first filler 111b and the second filler 112b may include, for example, either copper or nickel.

A boundary 111i between the first solder 111a and the first filler 111b may not be located at the same horizontal level as a boundary 112i between the second solder 112a and the second filler 112b, relative to the upper surface of the first drive circuit region 21 of the drive circuit board 20. However, the disclosure is not limited thereto. For example, the boundary 111i between the first solder 111a and the first filler 111b may be located at the same horizontal level as the boundary 112i between the second solder 112a and the second filler 112b, relative to the upper surface of the first drive circuit region 21 of the drive circuit board.

In FIG. 7, the boundary 111i between the first solder 111a and the first filler 111b, and the boundary 112i between the second solder 112a and the second filler 112b are illustrated as have a specific shape, but the disclosure is not limited thereto. For example, the boundary 111i between the first solder 111a and the first filler 111b, and the boundary 112i between the second solder 112a and the second filler 112b may have different shapes from the illustrated shape, in accordance with the manufacturing process of the light emitting diode display device.

The third bump 113 may be interposed between the second light emitting diode layer 120_2 and the first drive circuit region 21 of the drive circuit board 20. Specifically, the third bump 113 may be interposed between the second P electrode 102P and the third pad 213 disposed in the first drive circuit region 21 of the drive circuit board 20. The third bump 113 may be disposed on the third pad 213. For example, the third bump 113 may come into contact with an upper surface of the third pad 213 and a lower surface of the second P electrode 102P. At least a part of the third bump 113 may be inserted into the lower layer 121, and for example, may come into contact with the second P electrode 102P.

The fourth bump 114 may be interposed between the second light emitting diode layer 120_2 and the first drive circuit region 21 of the drive circuit board 20. Specifically, the fourth bump 114 may be interposed between the second N electrode 102N and the fourth pad 214 disposed in the first drive circuit region 21 of the drive circuit board 20. The fourth bump 114 may be disposed on the fourth pad 214. For example, the fourth bump 114 may come into contact with a top surface of the fourth pad 214 and a bottom surface of the second N electrode 102N. At least a part of the fourth bump 114 may, for example, be inserted into the lower layer 121 and may come into contact with the second N electrode 102N.

The fifth bump 115 may be interposed between the third light emitting diode layer 120_3 and the first drive circuit region 21 of the drive circuit board 20. Specifically, the fifth bump 115 may be interposed between the third P electrode 103P and the fifth pad 215 disposed in the first drive circuit region 21 of the drive circuit board 20. The fifth bump 115 may be disposed on the fifth pad 215. For example, the fifth bump 115 may come into contact with a top surface of the fifth pad 215 and a bottom surface of the third P electrode 103P. At least a part of the fifth bump 115 may, for example, be inserted into the lower layer 121, and may come into contact with the third P electrode 103P.

The sixth bump 116 may be interposed between the third light emitting diode layer 120_3 and the first drive circuit region 21 of the drive circuit board 20. Specifically, the sixth bump 116 may be disposed between the third N electrode 103N and the sixth pad 216 disposed in the first drive circuit region 21 of the drive circuit board 20. The sixth bump 116 may be disposed on the sixth pad 216. For example, the sixth bump 116 may come into contact with a top surface of the sixth pad 216 and a bottom surface of the third N electrode 103N. At least a part of the sixth bump 116 may, for example, be inserted into the lower layer 121 and may come into contact with the third N electrode 103N.

The third bump 113 may have the same configuration as that of the first bump 111 except the disposed position may be different from the first bump 111, and may include the same material as that contained in the first bump 111. The fifth bump 115 may have the same configuration as that of the first bump 111, and may include the same material as that contained in the first bump 111. The fourth bump 114 and the sixth bump 116 may have the same configuration as that of the second bump 112, and may include the same material as the material contained in the second bump 112.

Each of the first, third and fifth pads 211, 213, and 215 may be connected to a corresponding one of the first, second and third drive transistors TR1, TR2, and TR3. Each of the first, second and third drive transistors TR1, TR2, and TR3 may be disposed in the first drive circuit region 21 of the drive circuit board 20. Each of the first, third and fifth bumps 111, 113, and 115 may be connected to a corresponding one of the first, third and fifth drive transistors TR1, TR2, and TR3 through the first, third and fifth pads 211, 213, and 215, respectively. The first P electrode 101P may be connected to the first drive transistor TR1 via the first bump 111 and the first pad 211. The second P electrode 102P may be connected to the second drive transistor TR2 via the third bump 113 and the third pad 213. The third P electrode 103P may be connected to the third drive transistor TR3 via the fifth bump 115 and the fifth pad 215.

Each of the second, fourth and sixth pads 212, 214, and 216 may be connected to the ground voltage G. In some embodiments, the second, fourth and sixth pads 212, 214, and 216 may be connected in common to the ground voltage G via wire (not shown). Each of the second, fourth and sixth bumps 112, 114, and 116 may be connected to the ground voltage G via the second, fourth and sixth pads 212, 214, and 216, respectively. The first N electrode 101N may be connected to the ground voltage G via the second bump 112 and the second pad 212. The second N electrode 102N may be connected to the ground voltage G via the fourth bump 114 and the fourth pad 214. The third N electrode 103N may be connected to the ground voltage G via the sixth bump 116 and the sixth pad 216.

The first pad 211 may include a first pad layer 211a and a second pad layer 211b. The second pad layer 211b may be disposed on the first pad layer 211a. The second pad layer 211b may be interposed between the first bump 111 and the first pad layer 211a. The second pad layer 211b may come into contact with the first solder 111a.

The first pad layer 211a may include, for example, nickel. The second pad layer 211b may include, for example, gold. Each of the second pad 212, the third pad 213, the fourth pad 214, the fifth pad 215, and the sixth pad 216 may have the same configuration as that of the first pad 211, and may include the same materials as those contained in the first pad 211.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a connection contact (i.e., touching) unless the context indicates otherwise.

The non-conducting material layer 130 may be disposed between the first, second and third light emitting diode layers 120_1, 120_2, and 120_3 and the drive circuit board 20. For example, the non-conducting material layer 130 may be disposed between the first, second and third light emitting diode layers 120_1, 120_2, and 120_3 and the first drive circuit region 21. The non-conducting material layer 130 may be disposed on the side walls of the first, second and third light emitting diode layers 120_1, 120_2, and 120_3 and on the drive circuit board 20. The non-conducting material layer 130 may wrap the first to sixth pads 211, 212, 213, 214, 215, and 216, and the side surfaces of the first to sixth bumps 111, 112, 113, 114, 115, and 116. The non-conducting material layer 130 may fill between the first, second and third color conversion layers 151, 152, and 153 and the drive circuit board 20 and between the separation film 141 and the drive circuit board 20.

The light emitting diode display device according to some example embodiments can increase the fluidity of the non-conducting material layer 130 through the arrangement of a plurality of bumps as illustrated in FIG. 2, thereby improving the yield of the display device. For example, in a case where a plurality of bumps is arranged as illustrated in FIG. 3, when a non-conducting material contained in the non-conducting material layer 130 is injected between the first, second and third light emitting diode layers 120_1, 120_2, and 120_3 and the drive circuit board 20, as the non-conducting material moves along various directions, fluidity can be increased.

The first, second and third color conversion layers 151, 152, and 153 may be disposed on the first, second and third light emitting diode layers 120_1, 120_2, and 120_3, respectively. Each of the first, second and third color conversion layers 151, 152, and 153 may be surrounded by the separation film 141. The first, second and third light emitting diode pixels 11a, 11b, and 11c may be separated by, for example, the separation film 141.

The first, second, and third color conversion layers 151, 152, and 153 may convert the monochromatic light irradiated toward each of the first, second and third color conversion layers 151, 152, and 153 into monochromatic light of another color in the first, second and third light emitting diode layers 120_1, 120_2, and 120_3. The first, second and third color conversion layers 151, 152, and 153 may include, for example, a phosphor layer or a quantum dot.

A color filter layer may be disposed on the first, second, and third color conversion layers 151, 152, and 153. In the case where the color filter layers are disposed on the first, second and third color conversion layers 151, 152, and 153, for example, the three primary colors of RGB may be implemented in the first unit pixel 11.

Hereinafter, the light emitting diode display device according to some example embodiments will be described with reference to FIGS. 1 and 8 to 13. For the sake of clarity of explanation, the repeated description will be simplified or omitted.

Figure 8:
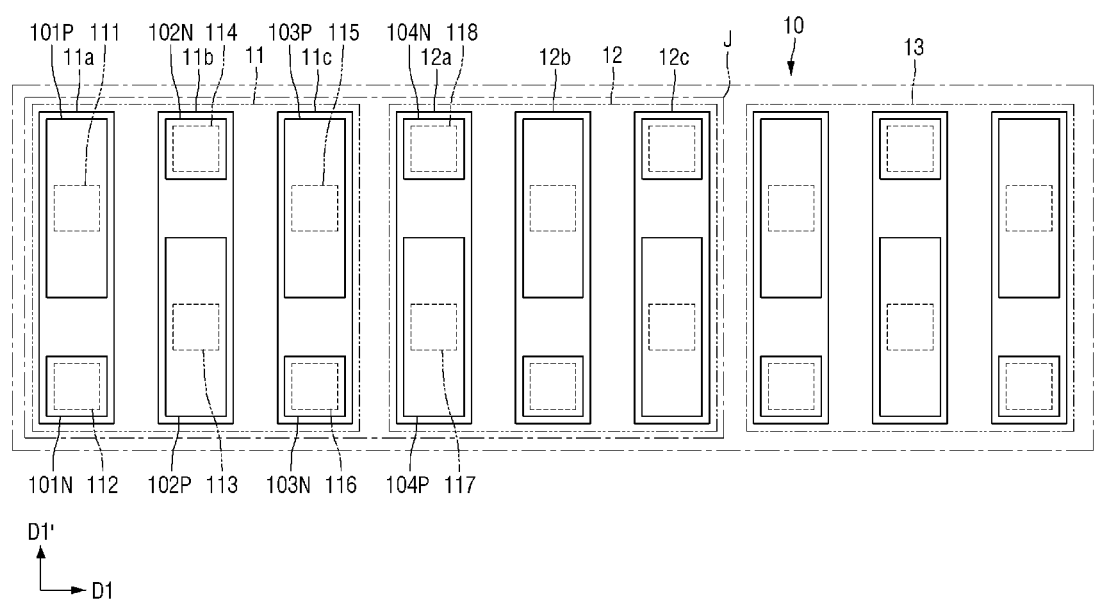
FIG. 8 is a diagram illustrating a partial region of the display board of FIG. 1.
Figure 9:
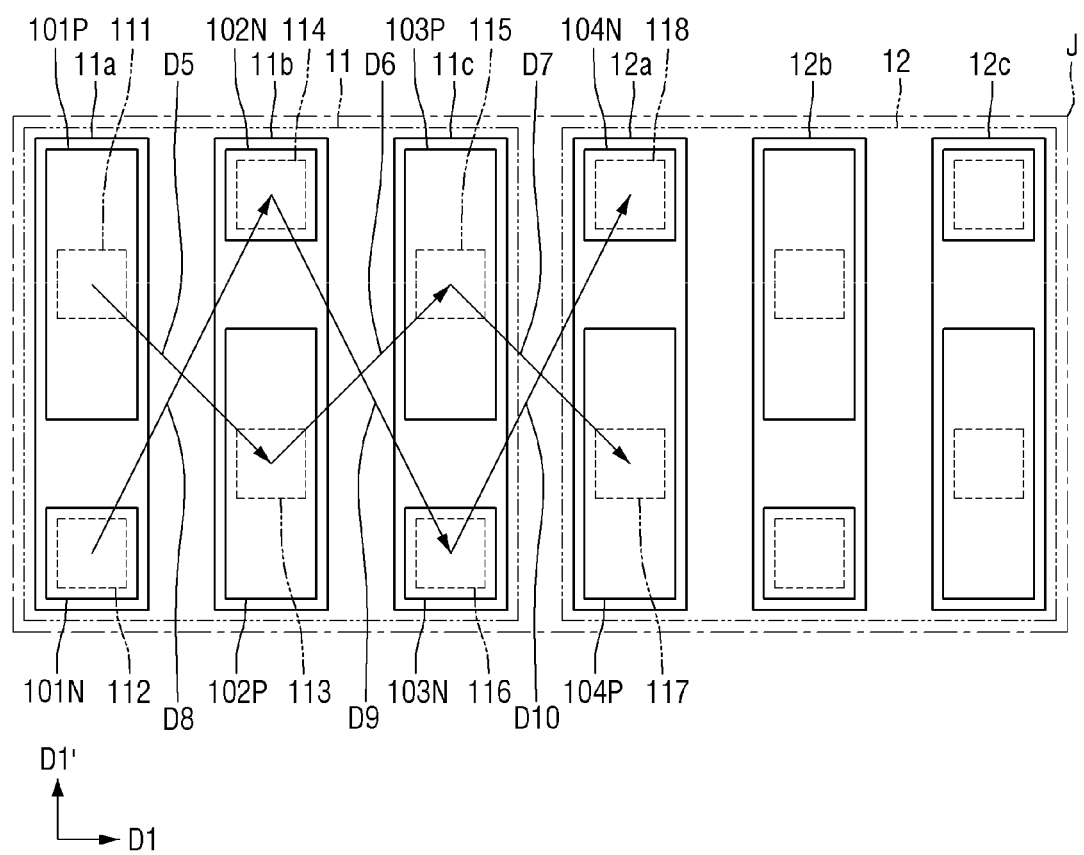
FIGS. 9 and 10 are enlarged views of a region J of FIG. 8, respectively.
Figure 10:
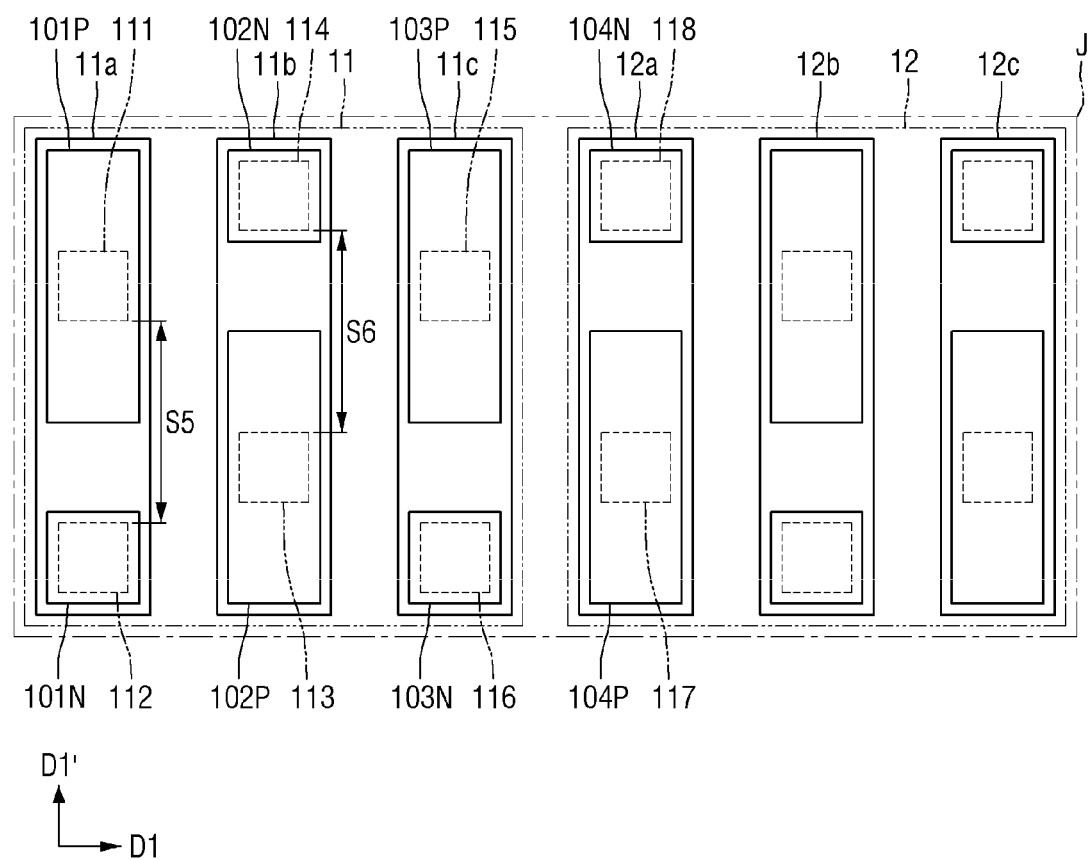

FIG. 8 is a diagram illustrating a partial region of the display board 10 of FIG. 1, and may be a plan view which illustrates the first unit pixel 11 and the second unit pixel 12 according to some example embodiments. FIGS. 9 and 10 are enlarged views of a region J of FIG. 8.

Referring to FIGS. 1, 8, 9 and 10, the first bump 111 and the third bump 113 may be spaced apart from each other along a fifth direction D5. The fifth direction D5 may be a direction intersecting with the first direction D1. For example, the fifth direction D5 and the first direction D1 may be directions intersecting with each other at an arbitrary angle, without being perpendicular to each other. For example, in the example where first light emitting diode pixel 11a and the second light emitting diode pixel 11b are adjacent to each other, the first bump 111, which is in contact with the first P electrode 101P, and the third bump 113, which is in contact with the second P electrode 102P, may not be aligned side by side, for example, along the first direction D1. Instead, the first bump 111 and the third bump 113 may be offset from one another in the first direction D1.

The third bump 113 and the fifth bump 115 may be spaced apart from each other along a sixth direction D6. The sixth direction D6 may be a direction intersecting with the first direction D1 and the fifth direction D5. For example, the sixth direction D6 may be a direction intersecting with each of the first direction D1 and the fifth direction D5, at an arbitrary angle, without being perpendicular thereto. For example, in the case where the second light emitting diode pixel 11b and the third light emitting diode pixel 11c are adjacent to each other, the third bump 113, which is in contact with the second P electrode 102P, and the fifth bump 115, which is in contact with the third P electrode 103P, may not be aligned side by side, for example, along the first direction D1.

The fifth bump 115 and the seventh bump 117 may be spaced apart from each other along a seventh direction D7. The seventh direction D7 may be a direction intersecting with the first direction D1, the fifth direction D5 and the sixth direction D6. For example, the seventh direction D7 may a direction intersecting with each of the first direction D1, the fifth direction D5 and the sixth direction D6, at arbitrary angles, without being perpendicular thereto. For example, in the case where the third light emitting diode pixel 11c and the fourth light emitting diode pixel 12a are adjacent to each other, the fifth bump 115, which is in contact with the third P electrode 103P, and the seventh bump 117, which is in contact with the fourth P electrode 104P, may not be aligned side by side, for example, along the first direction D1.

The second bump 112 and the fourth bump 114 may be spaced apart from each other along an eighth direction D8. The eighth direction D8 may be a direction intersecting with the first direction D1, the fifth direction D5, the sixth direction D6 and the seventh direction D7. For example, the eighth direction D8 may be a direction intersecting with each of the first direction D1, the fifth direction D5, the sixth direction D6 and the seventh direction D7 at arbitrary angles, without being perpendicular thereto. For example, in the case where first light emitting diode pixel 11a and the second light emitting diode pixel 11b are adjacent to each other, the second bump 112, which is in contact with the first N electrode 101N, and the fourth bump 114, which is in contact with the second N electrode 102N, may not be aligned side by side, for example, along the first direction D1.

The fourth bump 114 and the sixth bump 116 may be spaced apart from each other along a ninth direction D9. The ninth direction D9 may a direction intersecting with the first direction D1, the fifth direction D5, the sixth direction D6, the seventh direction D7 and the eighth direction D8. For example, the ninth direction D9 may be a direction intersecting with each of the first direction D1, the fifth direction D5, the sixth direction D6, the seventh direction D7 and the eighth direction D8 at arbitrary angles, without being perpendicular thereto. For example, in the case where the second light emitting diode pixel 11b and the third light emitting diode pixel 11c are adjacent to each other, the fourth bump 114, which is in contact with the second N electrode 102N, and the sixth bump 116, which is in contact with the third N electrode 103N, may not be aligned side by side, for example, along the first direction D1.

The sixth bump 116 and the eighth bump 118 may be spaced apart from each other along a tenth direction D10. The tenth direction D10 may be a direction intersecting with the first direction D1, the fifth direction D5, the sixth direction D6, the seventh direction D7, the eighth direction D8 and the ninth direction D9. For example, the tenth direction D10 may be a direction intersecting with each of the first direction D1, the fifth direction D5, the sixth direction D6, the seventh direction D7, the eighth direction D8 and the ninth direction D9, at arbitrary angles, without being perpendicular thereto. For example, in the case where the third light emitting diode pixel 11c and the fourth light emitting diode pixel 12a are adjacent to each other, the sixth bump 116, which is in contact with the third N electrode 103N, and the eighth bump 118, which is in contact with the fourth N electrode 104N, may not be aligned side by side, for example, along the first direction D1.

Each of the first P electrode 101P and the third P electrode 103P may be disposed on one side of each of the first N electrode 101N and the third N electrode 103N. Each of the second P electrode 102P and the fourth P electrode 104P may be disposed on the other side of each of the second N electrode 102N and the fourth N electrode 104N. The arrangement of the first P electrode 101P and the first N electrode 101N in the first light emitting diode pixel 11a, and the arrangement of the second P electrode 102P and the second N electrodes 102N in the second light emitting diode pixel 11b may be symmetrical with respect to the x-axis (for example, the axis extending along the first direction D1) from the viewpoint of the plan view.

A fifth distance S5 at which the first bump 111 and the second bump 112 are spaced apart from each other in the first' direction D1' in the first light emitting diode pixel 11a may be substantially the same as a sixth distance S6 at which the third bump 113 and the fourth bump 114 are spaced apart from each other in the first' direction D1' in the second light emitting diode pixel 11b.

Figure 11:
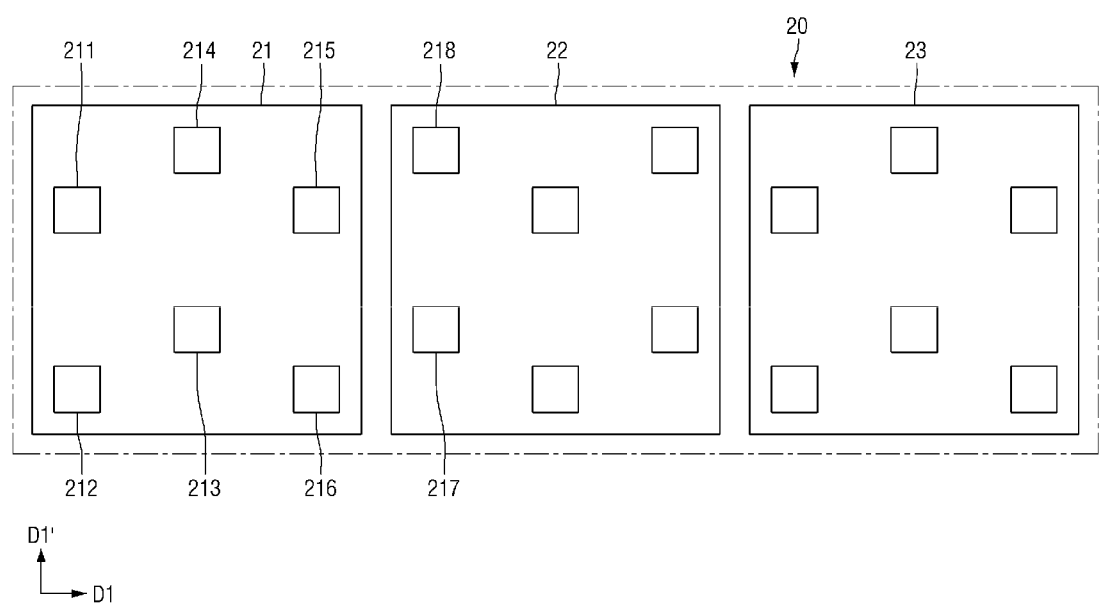
FIG. 11 is a diagram illustrating a partial region of the drive circuit board of FIG. 1.
Figure 12:
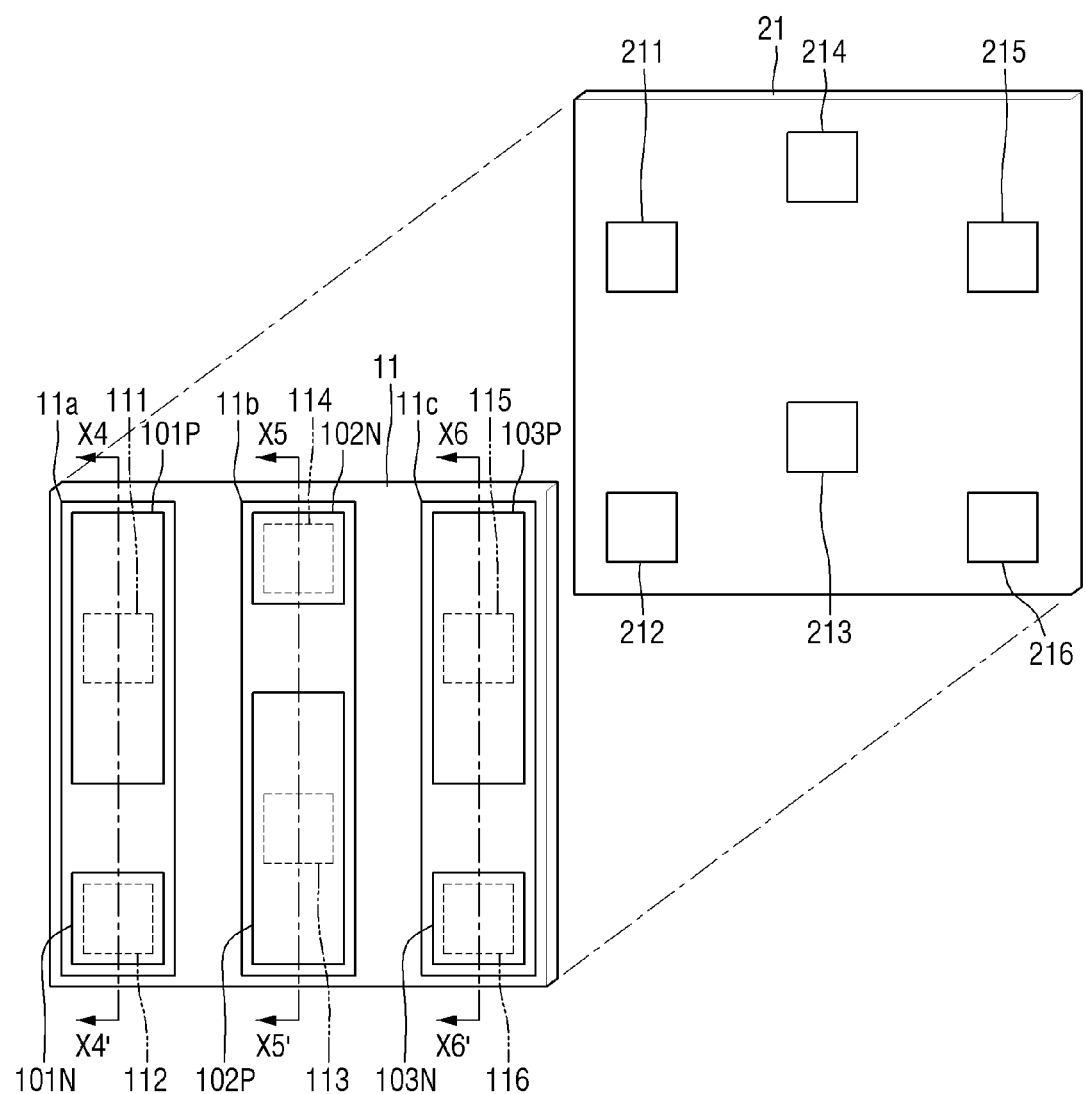
FIG. 12 is a diagram illustrating a part of each of the display board and the drive circuit board of FIG. 1.

FIG. 11 is a diagram illustrating a partial region of the drive circuit board 20 of FIG. 1, and may be a plan view which illustrates a first drive circuit region 21 and a second drive circuit region 22 according to some example embodiments. FIG. 12 is a diagram illustrating a part of each of the display board 10 and the drive circuit board 20 of FIG. 1.

Referring to FIGS. 1, 11 and 12, first, second, third, fourth, fifth and sixth pads 211, 212, 213, 214, 215, and 216 may be disposed in the first drive circuit region 21. A seventh pad 217 and an eighth pad 218 may be disposed in the second drive circuit region 22. Additional pads may be disposed in the second drive circuit region 22 and the third drive circuit region 23.

The first, second, third, fourth, fifth, and sixth pads 211, 212, 213, 214, 215, and 216 may be located to correspond to a respective one of the first, second, third, fourth, fifth, and the sixth bump 111, 112, 113, 114, 115, and 116.

The display board 10 and the drive circuit board 20 may be connected to each other, e.g., bonded, via a plurality of bumps.

Figure 13:
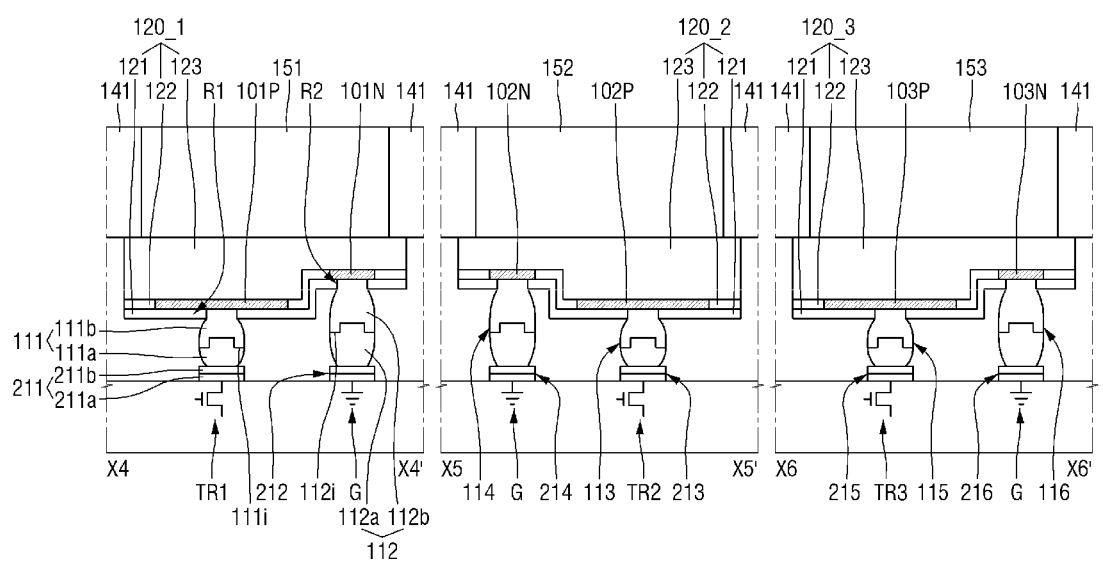
FIG. 13 is a cross-sectional view taken along lines X4-X4', X5-X5' and X6-X6' of FIG. 12.

FIG. 13 is a cross-sectional view taken along line X4-X4', X5-X5', and X6-X6' of FIG. 12. FIG. 13 may be a cross-sectional view taken along lines X4-X4', X5-X5', and X6-X6', after bonding the display board 10 and the drive circuit board 20 using a plurality of bumps.

Referring to FIGS. 12 and 13, the first bump 111 may be disposed on one side of the second bump 112 with respect to the longitudinal axis extending along the first direction D1. The third bump 113 may be disposed on the other side of the fourth bump 114 with respect to the longitudinal axis extending along the first direction D1. The fifth bump 115 may be disposed on one side of the sixth bump 116 with respect to the longitudinal axis extending along the first direction D1. For example, the first bump 111, the fourth bump 114, and the fifth bump 115 may be disposed on the same side of the longitudinal axis, and the second bump 112, the third bump 113, and the sixth bump 116 may be disposed on the other side of the longitudinal axis.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A light emitting diode display device comprising:
   a display board comprising a plurality of unit pixels;
   a drive circuit board which includes a plurality of drive circuit regions, each of the plurality of drive circuit regions corresponding to one of the plurality of unit pixels; and
   a plurality of bumps, each of the plurality of bumps being interposed between the each of the plurality of unit pixels and the corresponding one of the plurality of drive circuit regions to connect the display board and the drive circuit board,
   wherein the plurality of unit pixels comprises a first unit pixel comprising a first P electrode,
   wherein the plurality of drive circuit regions comprises a first drive circuit region which corresponds to the first unit pixel, the first drive circuit region including a first pad connected to a first drive transistor,
   wherein the plurality of bumps includes a first bump, the first bump including a first solder which is in direct contact with the first pad and a first filler disposed on the first solder and in direct contact with the first P electrode,
   wherein the first solder includes at least one of tin and silver, and
   wherein the first filler includes one of copper and nickel.

2. The light emitting diode display device according to claim 1,
   wherein the first unit pixel includes first and second light emitting diode pixels spaced apart from each other in a first direction,
   wherein the plurality of bumps includes a second bump,
   wherein the first drive circuit region includes a second pad connected to a second drive transistor,
   wherein the first P electrode is included in the first light emitting diode pixel,
   wherein the second light emitting diode pixel includes a second P electrode,
   wherein the second bump is interposed between the second pad and the second P electrode, and
   wherein the first bump and the second bump are spaced apart from each other along a second direction intersecting with the first direction.

3. The light emitting diode display device according to claim 2,
   wherein the first unit pixel includes a third light emitting diode pixel spaced apart from the first and second light emitting diode pixels in the first direction,
   wherein the plurality of bumps includes a third bump,
   wherein the first drive circuit region includes a third pad connected to a third drive transistor,
   wherein the third light emitting diode pixel includes a third P electrode,
   wherein the third bump is interposed between the third pad and the third P electrode, and
   wherein the second bump and the third bump are spaced apart from each other along a third direction intersecting with the first and second directions.

4. The light emitting diode display device according to claim 3,
   wherein the first light emitting diode pixel includes a first N electrode spaced apart from the first P electrode,
   wherein the second light emitting diode pixel includes a second N electrode spaced apart from the second P electrode,
   wherein the third light emitting diode pixel includes a third N electrode spaced apart from the third P electrode,
   wherein the first drive circuit region includes fourth, fifth, and sixth pads connected to a ground voltage,
   wherein the plurality of bumps includes fourth, fifth and sixth bumps,
   wherein the fourth bump is interposed between the fourth pad and the first N electrode,
   wherein the fifth bump is interposed between the fifth pad and the second N electrode,
   wherein the sixth bump is interposed between the sixth pad and the third N electrode, and wherein a first distance at which the first bump and the fourth bump are spaced apart from each other and a second distance at which the third bump and the sixth bump are spaced apart from each other are greater than a third distance at which the second bump and the fifth bump are spaced apart from each other.

5. The light emitting diode display device according to claim 3,
wherein the first light emitting diode pixel includes a first N electrode spaced apart from the first P electrode,
wherein the second light emitting diode pixel includes a second N electrode spaced apart from the second P electrode,
wherein the third light emitting diode pixel includes a third N electrode spaced apart from the third P electrode,
wherein the first drive circuit region includes fourth, fifth, and sixth pads connected to a ground voltage,
wherein the plurality of bumps includes fourth, fifth and sixth bumps,
wherein the fourth bump is interposed between the fourth pad and the first N electrode,
wherein the fifth bump is interposed between the fifth pad and the second N electrode,
wherein the sixth bump is interposed between the sixth pad and the third N electrode,
wherein the fourth bump and the fifth bump are spaced apart from each other along a fourth direction intersecting with the first, second and third directions, and
wherein the fifth bump and the sixth bump are spaced apart from each other along a fifth direction intersecting with the first, second, third and fourth directions.

6. The light emitting diode display device according to claim 2,
wherein the first light emitting diode pixel includes a first N electrode spaced apart from the first P electrode,
wherein the second light emitting diode pixel includes a second N electrode spaced apart from the second P electrode,
wherein the first drive circuit region includes third and fourth pads connected to a ground voltage,
wherein the plurality of bumps includes third and fourth bumps,
wherein the third bump is interposed between the third pad and the first N electrode,
wherein the fourth bump is interposed between the fourth pad and the second N electrode, and
wherein a first distance at which the first bump and the third bump are spaced apart from each other is greater than a second distance at which the second bump and the fourth bump are spaced apart from each other.

7. The light emitting diode display device according to claim 2,
wherein the first light emitting diode pixel includes a first N electrode spaced apart from the first P electrode,
wherein the second light emitting diode pixel includes a second N electrode spaced apart from the second P electrode,
wherein the first drive circuit region includes third and fourth pads connected to a ground voltage,
wherein the plurality of bumps includes third and fourth bumps,
wherein the third bump is interposed between the third pad and the first N electrode,
wherein the fourth bump is interposed between the fourth pad and the second N electrode, and
wherein the third bump and the fourth bump are spaced apart from each other along a third direction intersecting with the first and second directions.

8. A light emitting diode display device comprising:
a display board including first and second light emitting diode pixels spaced apart from each other and aligned with one another in a first direction;
first and second light emitting diode layers included in the first and second light emitting diode pixels, respectively;
first and second P electrodes disposed on the first and second light emitting diode layers, respectively;
a first bump which is in contact with the first P electrode; and
a second bump which is in contact with the second P electrode,
wherein the first bump and the second bump are spaced apart from each other along a second direction intersecting with the first direction.

9. The light emitting diode display device according to claim 8,
wherein the first bump includes a first solder and a first filler disposed on the first solder, the first filler being in direct contact with the first P electrode,
wherein the first solder includes at least one of tin and silver, and
wherein the first filler includes one of copper and nickel.

10. The light emitting diode display device according to claim 8, wherein the display board further comprises:
a third light emitting diode pixel spaced apart from the first and second light emitting diode pixels in the first direction; and
a third bump,
wherein the second light emitting diode pixel is disposed between the first and third light emitting diode pixels,
wherein the third light emitting diode pixel includes a third light emitting diode layer on which a third P electrode is disposed,
wherein the third bump is in contact with the third P electrode, and
wherein the second bump and the third bump are spaced apart from each other along a third direction intersecting with the first and second directions.

11. The light emitting diode display device according to claim 8,
wherein the first light emitting diode layer includes a first N electrode spaced apart from the first P electrode,
wherein the second light emitting diode layer includes a second N electrode spaced apart from the second P electrode,
wherein the light emitting diode display device further comprises:
a third bump which is in contact with the first N electrode; and
a fourth bump which is in contact with the second N electrode, and
wherein a first distance at which the first bump and the third bump are spaced apart from each other is greater than a second distance at which the second bump and the fourth bump are spaced apart from each other.

12. The light emitting diode display device according to claim 11, further comprising:
a drive circuit board connected to the display board by the first, second, third and fourth bumps,
wherein the drive circuit board includes a first drive circuit region which corresponds to the first and second light emitting diode pixels and includes first and second pads connected to first and second drive transistors, respectively, wherein the first bump is in contact with the first pad, wherein the second bump is in contact with the second pad, wherein the third bump is connected to a ground voltage and interposed between the first drive circuit region and the first light emitting diode layer, and wherein the fourth bump is connected to the ground voltage and interposed between the first drive circuit region and the second light emitting diode layer.

13. The light emitting diode display device according to claim 8, wherein the first light emitting diode layer includes a first N electrode spaced apart from the first P electrode, wherein the second light emitting diode layer includes a second N electrode spaced apart from the second P electrode, wherein the light emitting diode display device further comprises:
   a third bump which is in contact with the first N electrode; and
   a fourth bump which is in contact with the second N electrode, and
wherein the third bump and the fourth bump are spaced apart from each other along a third direction intersecting with the first and second directions.

14. The light emitting diode display device according to claim 8, further comprising:
   a drive circuit board connected to the display board by the first and second bumps, the drive circuit board including first and second drive transistors,
   wherein the drive circuit board includes a first drive circuit region which corresponds to the first and second light emitting diode pixels and includes first and second pads connected to the first and second drive transistors, respectively,
   wherein the first bump is in contact with the first pad, and
   wherein the second bump is in contact with the second pad.

15. A light emitting diode display device comprising:
   a drive circuit board including first, second, third, and fourth pads;
   first, second, third, and fourth bumps disposed on the first, second, third, and fourth pads, respectively;
   a first light emitting diode layer including a first P electrode being in contact with the first bump and a first N electrode being in contact with the second bump; and
   a second light emitting diode layer including a second P electrode being in contact with the third bump and a second N electrode being in contact with the fourth bump,
   wherein the first and third pads are respectively connected to first and second drive transistors included in the drive circuit board,
   wherein each of the second and fourth pads is connected to a ground voltage,
   wherein a first direction in which the second and fourth bumps are spaced apart from each other intersects with a second direction in which the first and third bumps are spaced apart from each other,
   wherein the first bump includes a first solder being in direct contact with the first pad and a first filler disposed on the first solder, the first filler being in direct contact with the first P electrode,
   wherein the first solder includes at least one of tin and silver, and
   wherein the first filler includes one of copper and nickel.

16. The light emitting diode display device according to claim 15, wherein a first distance at which the first bump and the second bump are spaced apart from each other is greater than a second distance at which the third bump and the fourth bump are spaced apart from each other.

17. The light emitting diode display device according to claim 15, wherein a first distance at which the first bump and the second bump are spaced apart from each other is equal to a second distance at which the third bump and the fourth bump are spaced apart from each other.

18. The light emitting diode display device according to claim 15, further comprising:
   a display board including a plurality of unit pixels,
   wherein the plurality of unit pixels includes a first unit pixel including first and second light emitting diode pixels,
   wherein each of the first and second light emitting diode pixels includes each of the first and second light emitting diode layers, and
   wherein the drive circuit board and the display board are connected by the first, second, third and fourth bumps.

19. The light emitting diode display device according to claim 18,
   wherein the drive circuit board further includes a fifth pad connected to a third drive transistor included in the drive circuit board and a sixth pad connected to the ground voltage,
   wherein the light emitting diode display device further includes fifth and sixth bumps disposed on the fifth and sixth pads, respectively,
   wherein the first unit pixel further includes a third light emitting diode layer including a third P electrode being in contact with the fifth bump and a third N electrode being in contact with the sixth bump, and
   wherein a third direction in which the third and fifth bumps are spaced apart from each other intersects with the first and second directions.

20. The light emitting diode display device according to claim 15, wherein the first pad includes a first pad layer and a second pad layer disposed on the first pad layer, the second pad layer being in contact with the first solder, wherein the first pad layer includes nickel, and wherein the second pad layer includes gold.

* * * * *